US007876099B2

(12) United States Patent
Wang et al.

(10) Patent No.: US 7,876,099 B2
(45) Date of Patent: Jan. 25, 2011

(54) KNEE COIL FOR MAGNETIC RESONANCE IMAGING

(75) Inventors: Hai Ning Wang, ShenZhen (CN); Jian Min Wang, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 107 days.

(21) Appl. No.: 12/398,290

(22) Filed: Mar. 5, 2009

(65) Prior Publication Data
US 2009/0322334 A1  Dec. 31, 2009

(30) Foreign Application Priority Data
Mar. 5, 2008  (CN) .................. 2008 1 0008056

(51) Int. Cl.
  *G01V 3/00* (2006.01)
(52) U.S. Cl. ..................... 324/318; 600/422
(58) Field of Classification Search ........... 324/318, 324/322; 600/422
See application file for complete search history.

(56) References Cited

U.S. PATENT DOCUMENTS

| 5,329,233 | A | * | 7/1994 | Hayes | 324/318 |
| 5,682,098 | A | * | 10/1997 | Vij | 324/318 |
| 6,300,761 | B1 | * | 10/2001 | Hagen et al. | 324/318 |
| 6,590,392 | B2 | * | 7/2003 | Boskamp et al. | 324/318 |
| 6,750,653 | B1 | * | 6/2004 | Zou et al. | 324/318 |
| 7,408,351 | B2 | * | 8/2008 | Yoshida | 324/318 |

* cited by examiner

*Primary Examiner*—Louis M Arana
(74) *Attorney, Agent, or Firm*—Schiff Hardin LLP

(57) ABSTRACT

A knee coil for magnetic resonance imaging has a first, a second and a third array of coil units, the first, second and third array of coil units forming a cylindrical shape, and being adjacent to each other in the direction perpendicular to the bottom of the cylindrical shape. Each of the first array of coil units and the third array of coil units is composed of two saddle coil units, and the second array of coil units is composed of six coil units, which are successively adjacent to each other in the direction of circumference of the cylinder side face. With a simple design and at a low cost, this knee coil ensures good capacity of parallel acquisition in all directions in the course of scanning while reducing the number of channels.

9 Claims, 7 Drawing Sheets

KNEE COIL FOR MAGNETIC RESONANCE IMAGING

BACKGROUND OF THE INVENTION

1. Field of the Invention

The present invention relates to the coils used in a magnetic resonance imaging system for acquiring the RF signals, and more particularly to a knee coil.

2. Description of the Prior Art

When the scan is performed using the exiting knee coils, a large number of coil units, for example, 18 coil units, are required to achieve the IPAT (Integrated Parallel Acquisition Techniques) in three directions, namely from head to foot, from left to right and from front to back (chest to back), in order to ensure the IPAT capability in the three directions.

The IPAT mentioned here refers to a technology that can save the scanning time, which has been widely adopted, including the specific examples of IPAT2 and IPAT3, wherein 2 and 3 are called IPAT factors. The work mechanism of IPAT can be simply seen as using the alternated point acquisition method to acquire signals and produce scan images. For instance, the method of acquiring a signal at every other point is called IPAT2. Due to the reduced number of signal acquisition points, the scanning time can be reduced by using the IPAT technology. Usually, to achieve IPAT2 in a given direction, the number of coil units in that direction must be equal to or greater than 2; likewise, to achieve IPAT3 in a given direction, the number of coil units in that direction must be equal to or greater than 3. Therefore, to achieve IPAT in three directions, more coil units are needed. In a normal case, each coil unit corresponds to one signal output channel, so more coil units mean more channels are required, which leads to increased cost of coils as well as work complexity.

FIG. 1 is a schematic diagram showing the structure of the existing knee coil comprising 18 coil units. As shown in FIG. 1, the knee coil as a whole is a cylindrical shape, wherein the cylinder side face is formed by a first array of coil units 101, a second array of coil units 102 and a third array of coil units 103 which are in turn adjacent to each other in the direction perpendicular to the bottom of said cylinder. In this case, each array of coil units has six coil units that are in turn adjacent to each other in the direction of the circumference of the cylinder side face (for simplicity, FIG. 1 only shows the construction of the second array of coil units 102, and the first array of coil units 101 and the third array of coil units 103 have the same construction as the second array of coil units 102). From FIG. 1 it can be seen that the knee coil is so constructed that it has IPAT3 capability in three directions. However, in practical use, each coil unit in such a knee coil needs to correspond to one signal output channel, which means that 18 signal output channels are required.

In order to resolve this problem, the existing technologies usually adopt the signal combination method. To be specific, this is to use a mixing bridge circuit to combine the signals from multiple coil units, for example, combining the signals from two coil units into one signal, or combining the signals from three coil units into two signals, and then the combined signals are output, thereby reducing the number of channels required. For the knee coil shown in FIG. 1, if there are only 8 signal output channels available, then 10 mixing bridge circuits are needed.

Although this solution can meet the need to reduce the number of channels, it has a number of problems, for example:

1) The coil has a large number of coil units (for example 18);

2) Due to the fact that the number of coil units is far greater than the number of available signal output channels, a great number (for example 10) of mixing bridge circuits are further needed;

3) Because there are many coil units and a large number of mixing bridge circuits are required, the cost of coils, the manufacturing outlay, and processing difficulty are increased greatly.

SUMMARY OF THE INVENTION

An object of the present invention is to provide a knee coil that can achieve IPAT capability in three directions during scanning by using fewer coil units.

This object Is achieved in accordance with the invention by a knee coil having a first, a second and a third array of coil units, wherein the first, second and third arrays of coil units form a cylindrical shape, and are in turn adjacent to each other in the direction perpendicular to the bottom of the cylinder, and wherein each of the first array of coil units and the third array of coil units has two saddle coil units, and the second array of coil units has six coil units that are in turn adjacent to each other in the direction of the circumference of the cylinder side face.

Each of the two saddle coil units in the first array of coil units is comprised of two parts, which are spaced and disposed in the direction of the circumference of the cylinder side face. A linking part connects these two parts. The two parts of the saddle coil unit and the two parts of the other saddle coil unit are disposed in alternation and are successively adjacent to each other in the direction of the circumference of the cylinder side face.

The two saddle coil units of the third array of coil units comprise two parts that are spaced and disposed in the direction of the circumference of the cylinder side face. A linking part connects these two parts. The two parts of the saddle coil unit and the two parts of the other saddle coil unit are disposed in alternation and are successively adjacent to each other in the direction of circumference of the cylinder side face.

The two adjacent parts of the two saddle coil units have an overlapping area for decoupling.

An overlapping area for decoupling is disposed in between every two adjacent coil units in the second array of coil units; an overlapping area for decoupling is disposed in between the adjacent first array of coil units and second array of coil units, as well as in between the adjacent second array of coil units and third array of coil units.

The first array of coil units is closed to one end of said cylindrical shape, and the third array of coil units is closed to the other end of the cylindrical shape.

Preferably, the knee coil further has a first mixing bridge circuit, a second mixing bridge circuit and an output circuit, and the six coil units in the second array of coil units are evenly divided into two groups. The first mixing bridge circuit is used to combine the signals acquired from one group of three coil units into two signals, and the second mixing bridge circuit is used to combine the signals acquired from the other group of three coil units into two signals. The output circuit is used to output the signals acquired from each coil unit in the first array of coil units and the third array of coil units, as well as the resulting signals as combined by the first mixing bridge circuit, and the resulting signals as combined by the second mixing bridge circuit.

Alternatively, the knee coil further has a first mixing bridge circuit, a second mixing bridge circuit and an output circuit, wherein the first mixing bridge circuit is used to combine the signals acquired from the two coil units in said first array of coil units into one signal, and the second mixing bridge circuit is used to combine the signals acquired from the two coil units in said third array of coil units into one signal. The output circuit is used to output the signal acquired from each coil unit in said second array of coil units, as well as the signal combined by said first mixing bridge circuit and the second mixing bridge circuit.

In accordance with the present invention, the saddle coil units can reduce the number of coil units in the knee coil down to 10, meanwhile ensuring a better IPAT capability in three directions during the scanning process. For the knee coil according to the present invention, the reduced number of the mixing bridge circuits required can be achieved thanks to the reduced number of coil units. Only two mixing bridge circuits are required to reduce the number of signal output channels required to 10. Owing to the reduced number of coil units and mixing bridge circuits required, the present invention also reduces the complexity of the coil construction, thus reducing the cost of coils, manufacturing outlay, and processing difficulty. In addition, the knee coil of the present invention requires only 10 signal output channels even if the mixing bridge circuits are not used, and the number of channels required is greatly reduced as compared to 18 signal output channels needed in the prior art.

DESCRIPTION OF THE PREFERRED EMBODIMENTS

Figure 1:
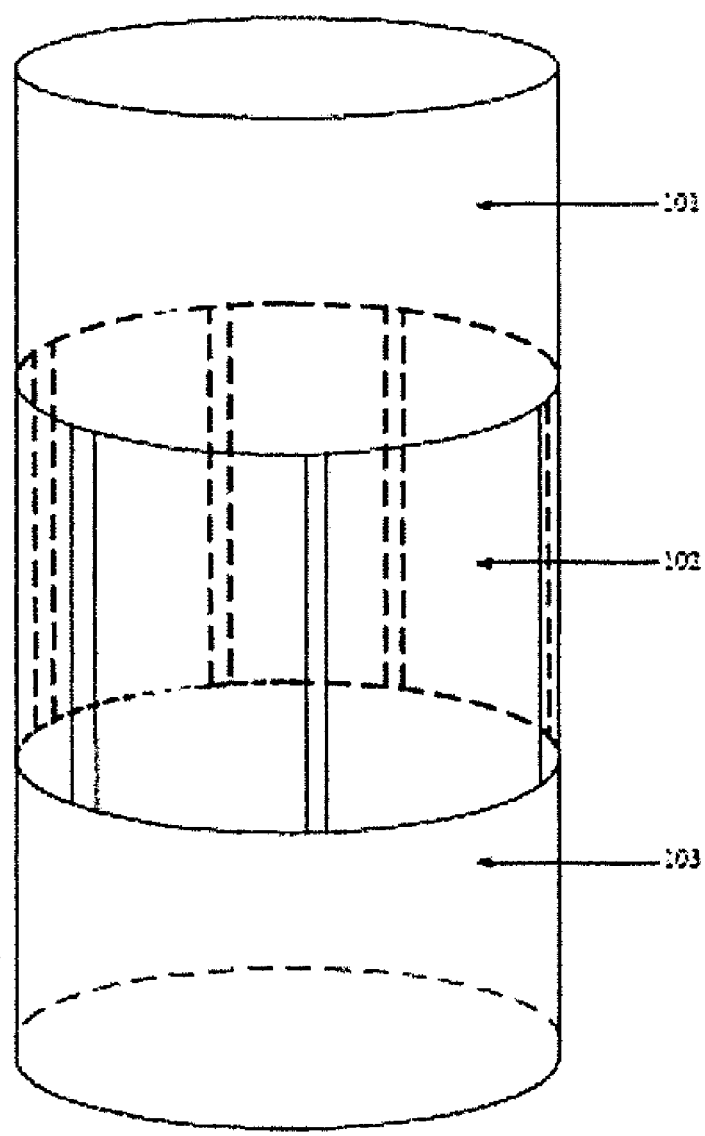
FIG. 1 is a schematic diagram showing the structure of an existing knee coil having 18 coil units.

In order to resolve the problems in the prior art, in an embodiment of the present invention, a new knee coil is proposed, which, with fewer coil units, simple design and lower cost, can ensure a better IPAT capability in all directions during scanning while further reducing the number of signal channels. The knee coil as described in the present invention has a first, a second and a third array of coil units, wherein the three arrays of coil units form a cylindrical shape, and are in turn adjacent to each other in the direction perpendicular to the bottom of the cylinder. It should be noted that the cylindrical shape referred to herein not only includes the strictly geometrical "cylindrical shape" (having a circular cross section), but also includes those "cylindrical shapes" that have a cross section of ellipse, polygon or D shape, and they are collectively called cylindrical shape herein for simplicity. In this case, the first array of coil units are closed to one end of the cylindrical shape, and the third array of coil units are closed to the other end of the cylindrical shape. Each of the first array of coil units and the third array of coil units has two saddle coil units, and the second array of coil units has six coil units that are in turn adjacent to each other in the direction parallel to the circumferential bottom of the cylinder side face.

To be specific, each of the two saddle coil units in the first array of coil units has two parts that are spaced and disposed in the direction of the circumference of the cylinder side face. A linking part connects said two parts. Two parts of one saddle coil unit and two parts of the other saddle coil unit are alternately disposed and in turn adjacent to each other in the direction of the circumference of the cylinder side face. The two saddle coil units of the third array of coil units comprise two parts that are spaced and disposed in the direction of the circumference of the cylinder side face. A linking part connects said two parts. Two parts of one saddle coil unit and two parts of the other saddle coil unit are alternately disposed and are in turn adjacent to each other in the direction of the circumference of the cylinder side face. An overlapping area for decoupling is disposed in between every two adjacent parts of said two saddle coil units. Likewise, an overlapping area for decoupling is disposed in between every two adjacent coil units in the second array of coil units, in between the adjacent first array of coil units and second array of coil units, as well as in between the adjacent second array of coil units and third array of coil units. The overlapping area herein refers to overlapping the marginal portions of two adjacent areas.

The knee coil of the present invention will be explained in more detail below by using the embodiments:

The knee coil described in the embodiments according to the present invention is as a whole in the shape of a cylinder, which comprises, from top to bottom, three arrays of coil units, namely, the first array of coil units, the second array of coil units and the third array of coil units.

Figure 2A:
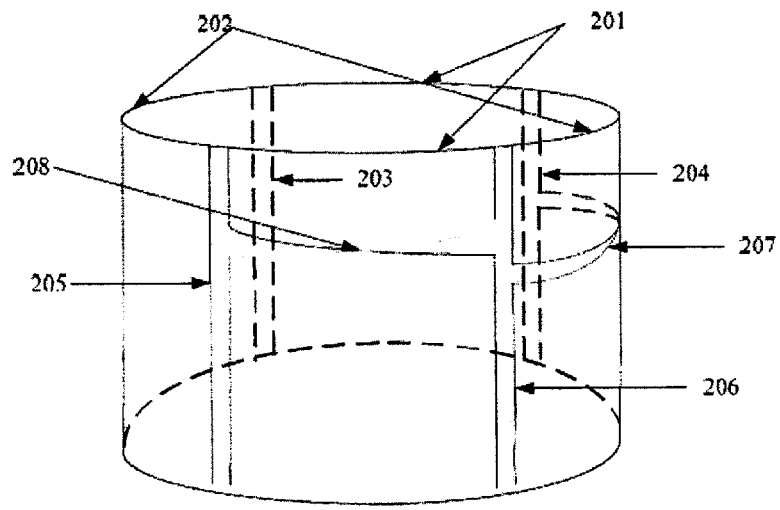
FIG. 2A is a schematic diagram showing the construction of the first array of coil units in an embodiment according to the present invention.
Figure 2B:
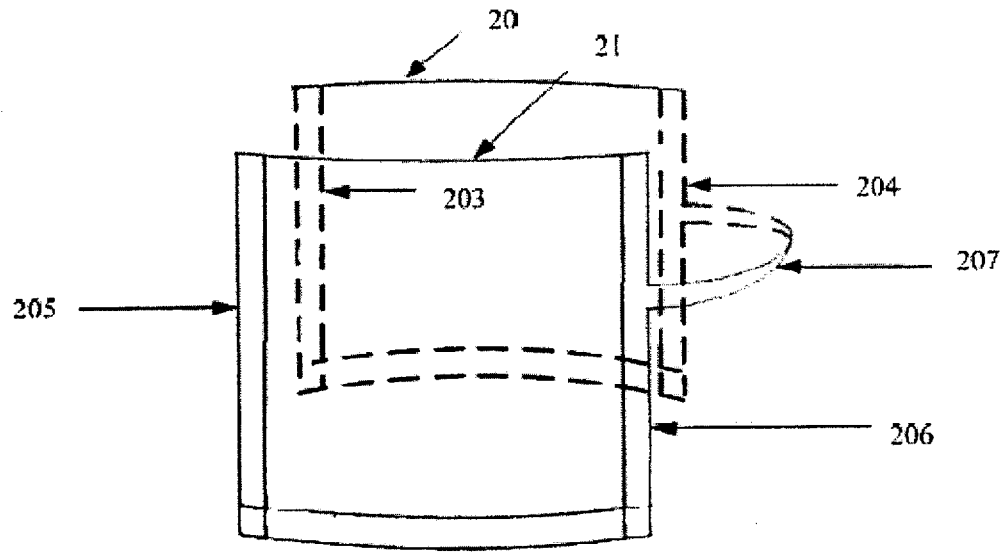
FIG. 2B is a schematic diagram showing the construction of the saddle coil units in the first array of coil units in an embodiment according to the present invention.
Figure 2C:
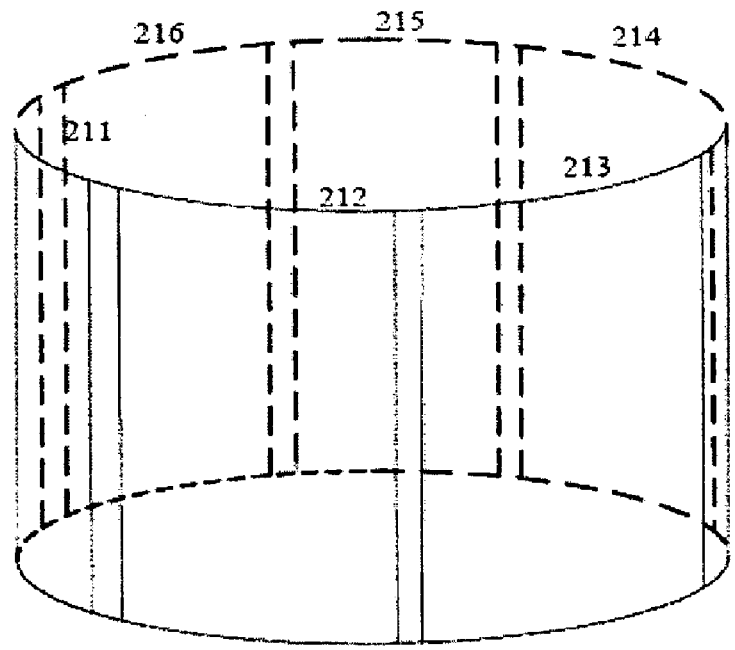
FIG. 2C is a schematic diagram showing the construction of the second array of coil units in an embodiment according to the present invention.
Figure 2D:
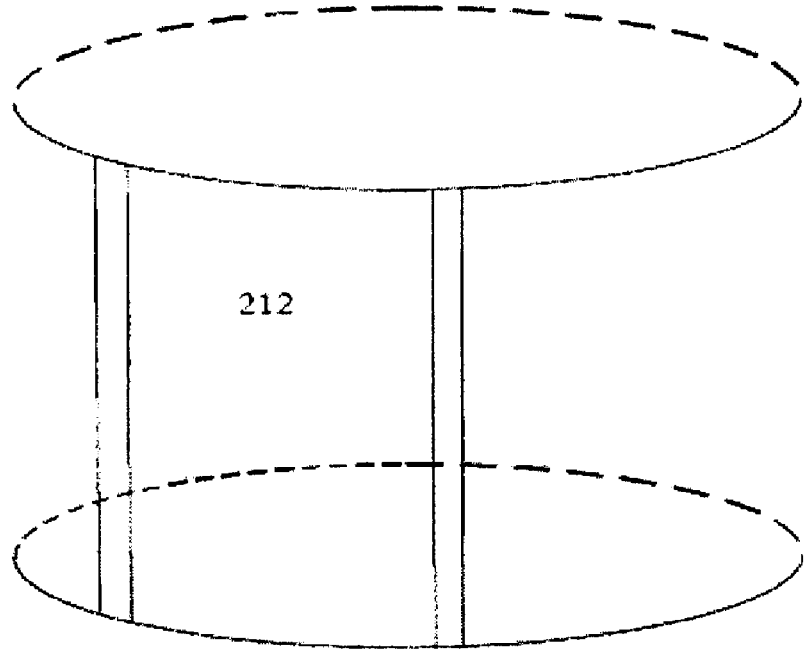
FIG. 2D is a schematic diagram showing the position of one coil unit in the second array of coil units in an embodiment according to the present invention.
Figure 2E:
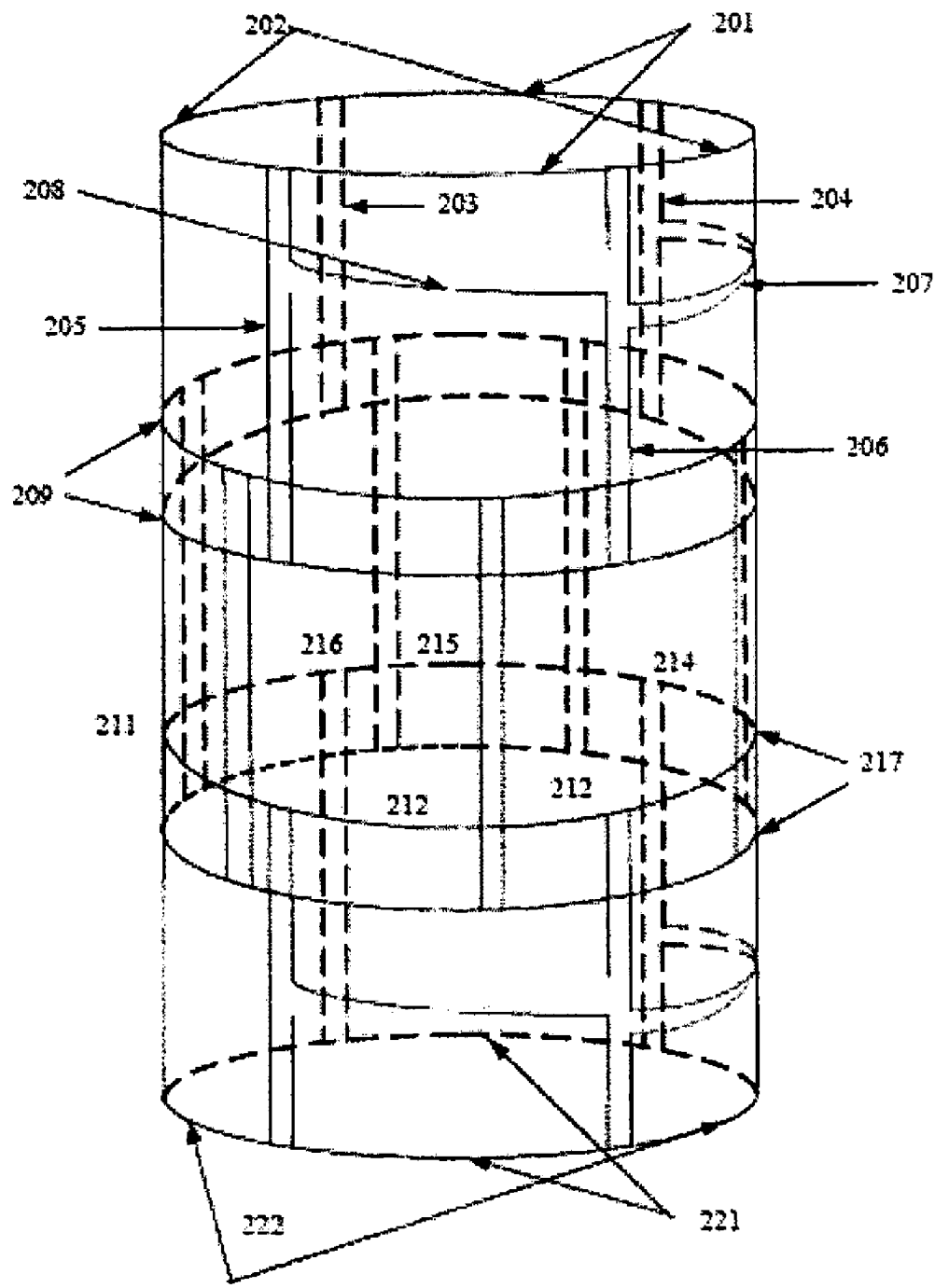
FIG. 2E is a schematic diagram showing the whole structure of a knee coil in an embodiment according to the present invention.

FIGS. 2A and 2B illustrate the construction of the knee coil of the present invention. In this case, FIG. 2A shows the construction of the first array of coil units; FIG. 2B shows the construction of the saddle coil units in the first array of coil units; FIG. 2C shows the construction of the second array of coil units; FIG. 2D shows the position of one coil unit in the second array of coil units; FIG. 2E shows the whole structure of the knee coil of the present invention.

As shown in the FIG. 2A, the first array of coil units includes two saddle coil units, namely coil units 201 and 202. The coil units 201 and 202 each further includes three parts. As shown in FIG. 2B, the coil units 201 include a first part 20, a second part 21 and a linking part 207, and the first part 20 and the second part 21 are connected via the linking part 207. In practical application, there is no requirement on the construction of the linking part 207, as long as it can connect the first part 20 to the second part 21. For example, the linking part 207 can be two wires that cross over each other, but the insulation of the crossover of the two wires must be ensured. Usually, the material of the linking part 207 is the same as that of coil unit, such as copper. The margins on the left and right sides of the first part 20 and second part 21 are the overlapping parts that separately form an overlapping area with the coil unit 202, indicated as 203, 204, 205 and 206 in FIG. 2B; likewise, the bottom margin of the first part 20 and second part 21 shown in FIG. 2B are the overlapping parts that are used to form an overlapping area with the second array of coil units.

The specific construction of the coil unit 202 is similar to that of the coil unit 201 shown in FIG. 2B, and is not repeated herein. Usually, the four parts 20 and 21 that form the coil units 201 and 202 have the same area, and are connected to other each to form the first array of coil units in the shape of a cylinder.

The second array of coil units has 6 coil units 211, 212, 213, 214, 215 and 216, the specific positions of these 6 coil units are shown in FIG. 2C, namely the coil units 211, 212, 213, 214, 215 and 216 that are connected with each other in counterclockwise direction as shown in FIG. 2C, and there is an overlapping area for decoupling between every two adjacent coil units. In order to describe its construction clearly, FIG. 2D shows the position of one coil unit 212 in the second array of coil units as shown in FIG. 2C. The coil unit 212 together with another five coil units forms the second array of coil units in the shape of a cylinder. Usually, the six coil units that form the second array of coil units have the same area, and of course, they can be different in area but may reduce the performance of the entire second array of coil units. The second array of coil units is usually located at the center in the direction perpendicular to the cylinder side face of the entire knee coil. Likewise, the top and bottom margins of the coil units 211, 212, 213, 214, 215 and 216 are the overlapping parts that are used to form an overlapping area respectively with the first array of coil units and the third array of coil units.

The third array of coil units also comprises two saddle coil units 221 and 222, as shown in FIG. 2E. The specific construction of the coil units 221 and 222 is basically the same as that of the coil units 201 and 202 with the only difference in that the top margin of the coil units 221 and 222 is the overlapping part that is used to form the overlapping area with the second array of coil units.

The first array of coil units, second array of coil units and third array of coil units are connected in the method shown in FIG. 2E, and form the overlapping area for decoupling in between the first array of coil units and second array of coil units as well as between the second array of coil units and third array of coil units with the overlapping parts described above, indicated as 209 and 217 in FIG. 2E.

These overlapping areas usually take up 10-20% of the total area of the coil units. In practical application, the size of the overlapping area should be determined through testing according to actual needs.

During scanning, each coil unit in the knee coil as shown in FIG. 2E separately acquires one signal. In a normal case, one signal corresponds to one output channel. However in many situations, the system itself has fewer channels than the coil units, which calls for the combination of the signals to reduce the number of channels needed. If this is the case, the knee coil of the present invention can further comprise two mixing bridge circuits and one output circuit.

Figure 3:
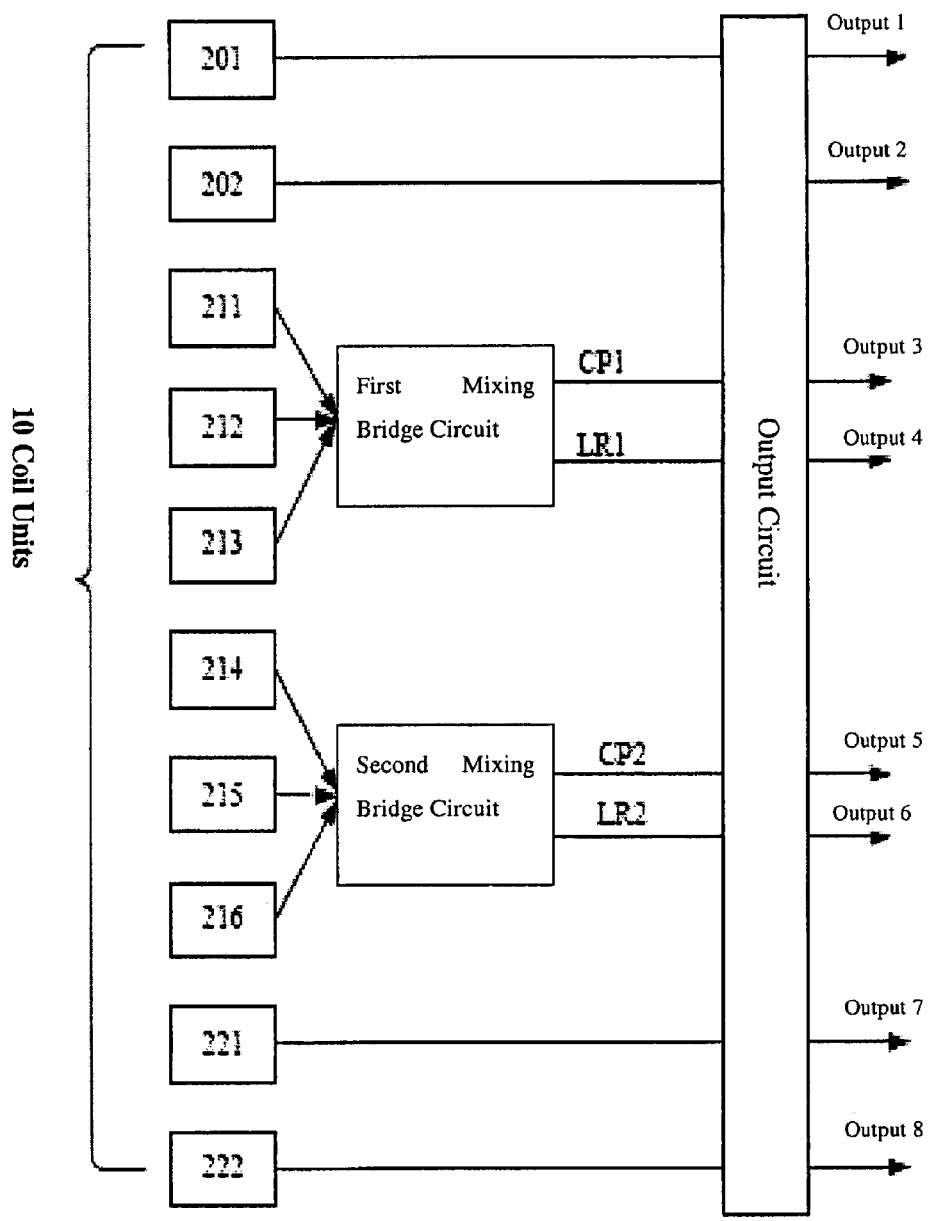
FIG. 3 is a schematic diagram showing one signal output method in an embodiment according to the present invention.

Under the situation shown in FIG. 3, the six coil units in the second array of coil units are evenly divided into two groups, the first mixing bridge circuit is used to combine the signals acquired from one group of three coil units into two signals, the second mixing bridge circuit is used to combine the signals acquired from the other group of three coil units into two signals. One output circuit is used to output the signals acquired by all coil units in the first array of coil units, the signals acquired by all coil units in the third array of coil units, the resulting signals as combined by the first mixing bridge circuit, and the resulting signals as combined by the second mixing bridge circuit.

Figure 4:
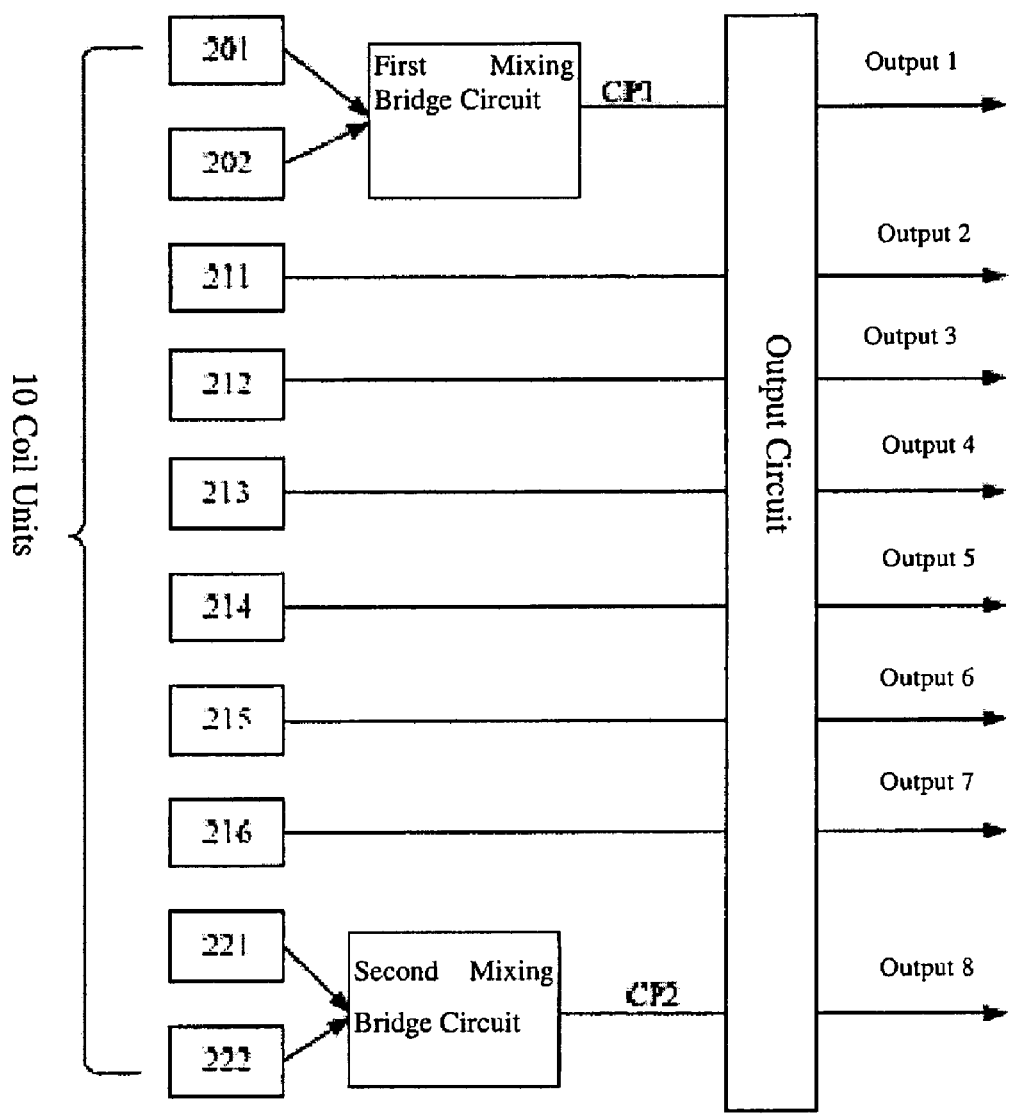
FIG. 4 is a schematic diagram showing another signal output method in an embodiment according to the present invention.

In the situation as shown in FIG. 4, the first mixing bridge circuit is used to combine the signals acquired from two coil units in the first array of coil units into one signal, the second mixing bridge circuit is used to combine the signals acquired from two coil units in the third array of coil units into one signal. One output circuit is used to output the signal acquired from each coil unit in the second array of coil units, the resulting signal as combined by the first mixing bridge circuit, and the resulting signal as combined by the second mixing bridge circuit.

In this case, the above said mixing bridge circuit and the structure of the output circuit and their specific arrangements on the knee coil are well known in the art and will not be repeated herein.

In an embodiment of the present invention, the combination methods shown in FIGS. 3 and 4 can be adopted:

FIG. 3 is a schematic diagram showing the way in which signals are output in an embodiment according to the present invention. As shown in FIG. 3, the signals from the coil units 201, 202, 221 and 222 can be output via the output circuit while the signals from the coil units 211, 212, 213, 214, 215 and 216 need to be combined, and the specific combination method is: combining the three signals from the coil units 211, 212, and 213 into circular polarization (CP) signal 1 and left right (LR) signal 1 by the first mixing bridge circuit, combining the three signals from the coil units 214, 215 and 216 into CP2 and LR2 signals by the second mixing bridge circuit, and outputting the four signals CP1, LR1, CP2 and LR2 via the output circuit. In this way, a total of only 8 channels are needed for outputting all signals, resulting in a lower number of channels required. In this case, the way in which the signals are combined by the mixing bridge circuit forms the prior art and will not be repeated herein.

FIG. 4 is a schematic diagram showing another signal output method in an embodiment of the present invention. As shown in FIG. 4, the signals from the coil units 211, 212, 213, 214, 215 and 216 can be output via the output circuit while the signals from the coil units 201, 202, 221 and 222 need to be combined, and the specific combination method is: combining the signals from the coil units 201 and 202 into CP1 by the first mixing bridge circuit and outputting them via the output circuit, combining the signals from the coil units 221 and 222 into CP2 by the second mixing bridge circuit and outputting them via the output circuit. Likewise, only 8 channels are needed for outputting all signals, resulting in a smaller number of channels required.

Of course, the combination methods shown in FIGS. 3 and 4 are only for illustration and are not intended to limit the technical solution of the present invention. It is also acceptable that the other combination methods commonly known in the art can be used to resolve the problem in the prior art. In conclusion, the methods shown in FIG. 3 and FIG. 4 can be adopted to achieve the goal of reducing the number of channels. However, these two methods are somewhat different in their performance in actual use. For example:

The method shown in FIG. 4 has a better signal-to-noise ratio in the middle area as compared to the method shown in FIG. 3. With the method shown in FIG. 4, the signals from all the coil units, that is, coil units 211, 212, 213, 214, 215 and 216, are not combined in the middle area and therefore no signal loss occurs, leading to better signal-to-noise ratio than with the method shown in FIG. 3. The method shown in FIG. 4 can provide IPAT3 capability in three directions: as shown in FIG. 2E, although the method shown in FIG. 4 combines the signals at both top and bottom ends, there is still a signal respectively at both ends after combination, which can be treated as if there is still a coil unit at both ends. In this way, in the head to foot direction, because the coil units in the first array of coil units, second array of coil units and third array of coil units coexist, meeting the condition mentioned earlier, "to achieve IPAT3 capability in a given direction, the number of the coil units in that direction must be equal to or greater than 3", the IPAT3 capability is available in this direction. In the left to right direction, because the coil units 211, 212 and 213 coexist, the IPAT3 capability is also available in this direction. Similarly, the IPAT3 capability is also available in the front to back direction.

The method shown in FIG. 3 has a better signal-to-noise ratio at both top and bottom end than the method shown in FIG. 4, because the signals from the first and third arrays of coil units are not combined. In addition, the method shown in FIG. 3 also has IPAT3 capability in the head to foot direction, and because there are still four coil units remaining after six coil units in the second array of coil units are combined, the front to back and left to right directions have at least the IPAT2 capability.

Figure 5:
FIG. 5 is a schematic diagram showing a clinical image obtained from scanning by using the existing knee coil that has an IPAT factor of 1.
Figure 6:
FIG. 6 is a schematic diagram showing a clinical image obtained from scanning by using the existing knee coil that has an IPAT factor of 2.
Figure 7:
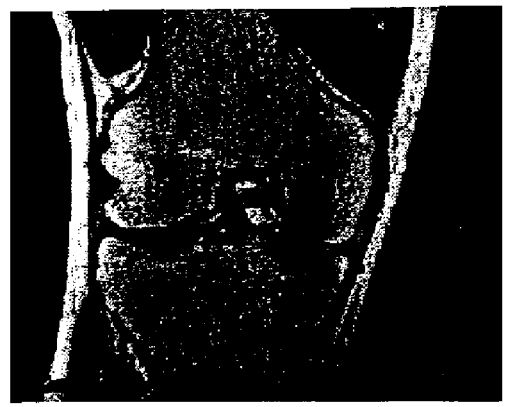
FIG. 7 is a schematic diagram showing a clinical image obtained from scanning by using the existing knee coil that has an IPAT factor of 3 as described in an embodiment according to the present invention.

It can be seen from the above description that not only the number of channels required can be reduced, but also a better IPAT capability can be obtained by adopting the knee coil and signal output method of the present invention. However, it is commonly known by the technicians in this field that the IPAT technology may downgrade the imaging quality to a certain degree. Therefore, the following describes whether or not the solution of the present invention has impact on the imaging quality through specific examples:

FIGS. 5, 6 and 7 show clinical images obtained from scanning of the same site. In which case, FIG. 5 shows the clinical image obtained from scanning by adopting the prior knee coil with an IPAT factor of 1, that is, without using the IPAT technology; FIG. 6 shows the clinical image obtained from scanning by adopting the prior knee coil with an IPAT factor of 2; FIG. 7 shows the clinical image obtained from scanning by adopting the knee coil of the present invention with an IPAT factor of 3. It can be seen that although the knee coil proposed by the present invention has only 10 coil units, it can still provide IPAT3 capability in three directions, as compared with the prior knee coil comprising 18 coil units. The knee coil of the present invention can greatly reduce the number of coil units while shortening the scanning duration. As compared with the images generated by the existing knee coils without parallel acquisition as shown in FIG. 5, the knee coil of the present invention is able to generate the images in comparable quality and in an obviously reduced time. As compared with the images generated by the existing knee coils without parallel acquisition that uses the IPAT factor of 2 as shown in FIG. 6, the knee coil of the present invention is able to generate the images in comparable quality and in a shorter time In conclusion, the following benefits can be achieved by using the technical solution of the present invention: 1) reducing the number of coil units, that is only 10 coil units are required, while ensuring a better IPAT capability in three directions; 2) the present invention adopts two saddle coil units, which can be arranged around the cylinder, thus reducing the number of coil units, resulting in a reduced number of the mixing bridge circuits, complexity of coil construction and coil cost as well as commissioning work and processing difficulty; 3) even if the mixing bridge circuit is not used, only 10 signal output channels are needed, which can be utilized in the systems having fewer channels.

Although modifications and changes may be suggested by those skilled in the art, it is the intention of the inventors to embody within the patent warranted hereon all changes and modifications as reasonably and properly come within the scope of their contribution to the art.

We claim as our invention:

1. A knee coil comprising:
   a first, a second and a third array of coil units, said first, second and third array of coil units forming a cylindrical shape, and being adjacent to each other in a direction perpendicular to a bottom of said cylindrical shape;
   each of the first array of coil units and the third array of coil units comprising two saddle coil units; and
   the second coil units comprising six coil units that are successively adjacent to each other in a direction of the circumference of a side face of said cylindrical shape.

2. The knee coil as claimed in claim 1, wherein each of the two saddle coil units in said first array of coil units comprises two parts that are spaced and disposed in the direction of the circumference of said side face of said cylindrical shape and wherein said knee coil further comprises
   a linking part connecting said two parts, the two parts of said saddle coil unit and the two parts of the other saddle coil unit being disposed in alternation and successively adjacent to each other in the direction of the circumference of said side face of said cylindrical shape.

3. The knee coil as claimed in claim 2, wherein the two adjacent parts of said two saddle coil units have an overlapping area for decoupling.

4. The knee coil as claimed in claim 1, wherein each of the two saddle coil units in said third array of coil units comprises two parts that are spaced and disposed in the direction of the circumference of said side face of said cylindrical shape, and wherein said knee coil further comprises:
   a linking part connecting said two parts, the two parts of the saddle coil unit and the two parts of the other saddle coil unit being disposed in alternation and successively adjacent to each other in the direction of the circumference of said side face of said cylindrical shape.

5. The knee coil as claimed in claim 4, wherein the two adjacent parts of said two saddle coil units have an overlapping area for decoupling.

6. The knee coil as claimed in claim 1, wherein an overlapping area for decoupling is disposed in between every two adjacent coil units in said second array of coil units, an overlapping area for decoupling is disposed in between the adjacent first array of coil units and second array of coil units, as well as in between the adjacent second array of coil units and third array of coil units.

7. The knee coil as claimed in claim 1, wherein that said first array of coil units is closed to one end of said cylindrical shape, and said third array of coil units is closed to the other end of said cylindrical shape.

8. The knee coil as claimed in claim 1, further comprising:
a first mixing bridge circuit, a second mixing bridge circuit and an output circuit;
the six coil units in said second array of coil units being uniformly divided into two groups, said first mixing bridge circuit combining signals acquired from one group of three coil units into two resulting signals, and said second mixing bridge circuit combining signals acquired from the other group of three coil units into two resulting signals; and
said output circuit emitting the signals acquired from each coil unit in said first array of coil units and said third array of coil units, the resulting signals combined by said first mixing bridge circuit and the resulting signals combined by said second mixing bridge circuit.

9. The knee coil as claimed in claim 1, further comprising:
a first mixing bridge circuit, a second mixing bridge circuit and an output circuit;
said first mixing bridge circuit combining signals acquired from two coil units in said first array of coil units into one resulting signal, said second mixing bridge circuit combining the signals acquired from two coil units in said third array of coil units into one resulting signal; and
said output circuit emitting the signals acquired from each coil unit in said second array of coil units, as well as the resulting signal combined by said first mixing bridge circuit and the resulting signal combined by said second mixing bridge circuit.

\* \* \* \* \*